United States Patent
Ito et al.

(10) Patent No.: US 6,949,328 B2
(45) Date of Patent: Sep. 27, 2005

(54) METHOD FOR MANUFACTURING ELECTROLUMINESCENT ELEMENT

(75) Inventors: Norihito Ito, Tokyo (JP); Hironori Kobayashi, Tokyo (JP)

(73) Assignee: Dai Nippon Printing Co, LTD, Tokyo-to (JP)

( * ) Notice: Subject to any disclaimer, the term of this patent is extended or adjusted under 35 U.S.C. 154(b) by 0 days.

(21) Appl. No.: 10/663,075

(22) Filed: Sep. 16, 2003

(65) Prior Publication Data
US 2004/0155578 A1 Aug. 12, 2004

(30) Foreign Application Priority Data
Sep. 18, 2002 (JP) ........................................ 2002-272175

(51) Int. Cl.$^7$ ................................................ H01J 9/227
(52) U.S. Cl. ........................... 430/321; 430/319; 445/24
(58) Field of Search ................................. 430/319, 321; 445/24; 313/504, 506

(56) References Cited

U.S. PATENT DOCUMENTS

2004/0075384 A1 * 4/2004 Aoki .......................... 313/506

FOREIGN PATENT DOCUMENTS

| JP | 2003-229261 A | * | 8/2003 |
| JP | 2001-237069 A | * | 8/2004 |
| JP | 2003-229255 A | * | 8/2004 |

* cited by examiner

Primary Examiner—John A. McPherson
(74) Attorney, Agent, or Firm—Timothy J. Keefer; Seyfarth Shaw LLP

(57) ABSTRACT

A method for manufacturing an electroluminescent element includes forming a hole injecting layer on a first electrode layer a base material with the first electrode layer formed in a pattern; a decomposition removing process of using a photocatalyst treatment layer substrate having at least a photocatalyst treatment layer, placing the base material and the photocatalyst treatment layer substrate facing each other with a gap of 200 μm or less, decomposing and removing the hole injecting layer, in a pattern, on the base material by irradiating from predetermined direction; forming a light emitting layer on the pattern formed hole injecting layer remaining on the base material; and forming a second electrode layer on the light emitting layer; wherein a contact angle to a liquid of the surface of the hole injecting layer is smaller than the contact angle to a liquid of the surface bared by removing the hole injecting layer.

16 Claims, 3 Drawing Sheets

METHOD FOR MANUFACTURING ELECTROLUMINESCENT ELEMENT

BACKGROUND OF THE INVENTION

1. Field of the Invention

The present invention relates to a method for manufacturing an electroluminescent (hereinafter, electroluminescent is abbreviated as EL in some cases) element which is excellent in manufacturing efficiency.

2. Description of the Related Art

In EL elements, holes and electrons injected from facing electrodes bond in a light emitting layer, excites a fluorescent substance in the light emitting layer by the energy, and emit light in color corresponding to the fluorescent substance, therefore, EL elements attract attention as a sheet display element of self light emitting type. Among them, organic thin film EL displays using an organic substance as a light emitting material, have high light emitting efficiency such as realizing of emission of high brightness even if the applied voltage is slightly less than 10 V, and the like, are capable of emitting light with a simple element structure, and there are expectations of application thereof to advertisement displays on which a specific pattern is emitted and displayed and to other low cost simple displays.

As methods for manufacturing such organic EL elements, electrodes or divisional coating of the organic EL layers which show different light emitting colors is necessary. For the low molecular weight materials, method in which materials having different light emitting colors are vapor deposited via a shadow mask, and for the high molecular weight materials, methods in which divisional coating is done by the ink jet method are mainly used.

For example, as described in the Japanese Patent Application Laid Open (JP-A) No. 2000-323276, there is a method in which, by applying an oxygen plasma treatment and $CF_4$ plasma treatment consecutively onto the first electrode layer comprising patterning assisting layer in between the pixels, the electrode layer is made hydrophilic, and the patterning assisting layer (organic) part is made water repellent. And the light emitting layer is formed by the ink discharged from the nozzles of the ink jet apparatus. In this case, it is very important that the patterning assisting layer has water repellency because the above mentioned ink avoids the patterning assisting layer and impacts on the first electrode layer which is a hydrophilic part. However, in this method, when the hole injecting layer is needed to be formed before forming the light emitting layer, since the patterning assisting layer has water repellency, the hole injecting layer is also needed to be formed by the ink jet method. And when a procedure of forming the hole injecting layer on the entire surface is needed, the water repellency of the patterning assisting layer is lost so that forming of the light emitting layer by the ink jet method is difficult in some cases.

Moreover, for high molecular weight materials, method for manufacturing is simpler than the low molecular weight materials, but it is inferior, by far, to the low molecular weight materials in terms of the light emitting efficiency. One reason for the above is that a procedure of improving the efficiency generally used for the low molecular weight materials, which the materials of different band gap energies are laminated and the injected carriers are spatially trapped, is not used for the high molecular weight materials. That is because the high molecular weight materials are solvent soluble, it is necessary that the polarities of the solvent used for each layer differ widely in order to laminate different materials and selectivity of material is extremely narrow.

For method for manufacturing a structure effective for trapping the carries in such high molecular weight materials, a structure is effective which controls the electrical properties and traps the carriers spatially by laminating insulating material, semiconductor material, and conductor material layer-by-layer by forming very thin films by self-assembling.

For example, as described in (JP-A) No.2001-516939, there is a report for improving the light emitting efficiency by the carrier trapping effect with a structure wherein the electrical properties are controlled spatially by laminating the hole injecting layer using different materials by layer-by-layer self-assembling method. Moreover, layers can be formed by dipping a substrate repeatedly into aqueous solutions of high molecular weight materials with different electric charges so that the selectivity of the material is wide. However, in this method, films cannot be formed selectively on the substrate and films are formed on the entire surface of the substrate. Therefore, the water repellency of the patterning assisting layer is lost, that makes it difficult to form the light emitting layer by the ink jet method.

In addition, though formation of the organic light emitting layer by the ink jet method is still an effective procedure, formation of all the layers, which the organic EL layer is formed, by the ink jet method leads to problems such as the deterioration of through put and decrease of the yield.

SUMMARY OF THE INVENTION

As mentioned above, there have been a need for provision of a method for manufacturing an EL element which can manufacture the EL element efficiently even in a case where patterning of a hole injecting layer is difficult and the hole injecting layer is needed to be formed on the entire surface of a substrate.

The present invention provides a method for manufacturing an electroluminescent element comprising at least:

a hole injecting layer forming process of forming a hole injecting layer, which can be decomposed and removed by the action of a photocatalyst in irradiation with energy, on a first electrode layer formed side surface of a base material with the first electrode layer formed on the surface in a pattern;

a decomposition removing process of using a photocatalyst treatment layer substrate having at least a photocatalyst treatment layer containing a photocatalyst formed on a substrate, placing the base material with the hole injecting layer formed thereon and the photocatalyst treatment layer substrate with a gap of 200 $\mu$m or less so that the photocatalyst treatment layer substrate and the hole injecting layer are facing to each other, and then, decomposing and removing the hole injecting layer in between the first electrode layers, in a pattern, on the base material with the hole injecting layer formed thereon by irradiating with energy from predetermined direction;

a light emitting layer forming process of forming the light emitting layer on the pattern formed hole injecting layer remaining on the base material; and a second electrode layer forming process of forming the second electrode layer on the light emitting layer;

wherein a contact angle to a liquid of the surface of the hole injecting layer is smaller than the contact angle to a liquid of the surface bared by removing the hole injecting layer in the decomposition removing process.

In the present invention, patterning is done by irradiating energy via the photocatalyst treatment layer after forming the hole injecting layer, on the entire surface, which can be decomposed and removed by the action of a photocatalyst in irradiation with energy. And also, since the hole injecting layer surface has better wettability compared to the surface which is bared by the removal of the hole injecting layer, it becomes possible to coat the light emitting layer forming coating solution only onto the hole injecting layer by, for example, the ink jet method. That makes it relatively easy to pattern the hole injecting layer and the light emitting layer formed thereon.

In the above mentioned invention, it is preferable that a liquid repellent convex part is formed in between the first electrode layers. By accordingly comprising the liquid repellent convex part in between the first electrode layers, the part which the hole injecting layer is removed becomes the liquid repellent convex part so that the subsequently formation of the light emitting layer using the ink jet method will become easy.

In the above mentioned invention, it is preferable that a width of the liquid repellent convex part is narrower than a clearance in between the first electrode layers. That is to prevent a short circuit due to the bareness of the first electrode layer.

In the above mentioned invention, it is preferable that the hole injecting layer is a layer-by-layer self-assembled film consisting of a cationic polymer and an anionic polymer. By using such a layer-by-layer self-assembled film as the hole injecting layer, light emitting efficiency of the light emitting layer can be improved.

In the above mentioned invention, it is preferable that an outermost film of the layer-by-layer self-assembled film is a film comprising a semiconductor polymer or an insulating polymer. That is because the light emitting efficiency is improved by this.

In the above mentioned invention, it is preferable that the photocatalyst treatment layer substrate comprises the substrate and the photocatalyst treatment layer formed in a pattern on the substrate. By accordingly forming the photocatalyst treatment layer in a pattern, it becomes possible to decompose and remove the hole injecting layer in a pattern without using a photomask. Moreover, since only the surface corresponding to the photocatalyst treatment layer is decomposed and removed, the irradiated energy is not particularly limited to a parallel energy, and the energy irradiating direction is not particularly limited, there is advantages that selectivity of the types of the energy sources and arrangement will widely increased.

In the above mentioned invention, it is preferable that the photocatalyst treatment layer substrate comprises the substrate, photocatalyst treatment layer formed on the substrate, and a photocatalyst treatment layer side light shielding part formed in a pattern, and the irradiation with energy in the decomposition removing process is carried out from the photocatalyst treatment layer substrate. By accordingly comprising the photocatalyst treatment layer side light shielding part on the photocatalyst treatment layer substrate, use of a photomask or the like in the irradiation with energy. Therefore, alignment with the photomask is not necessary so that simplifying of the processes is possible.

In the above mentioned invention, it is preferable that the photocatalyst treatment layer substrate is that the photocatalyst treatment layer side light shielding part is formed on the substrate in a pattern, and the photocatalyst treatment layer is further formed thereon, and particularly, it is preferable that the photocatalyst treatment layer substrate is that the photocatalyst treatment layer is formed on the photocatalyst treatment layer side light shielding part, via a primer layer, formed in a pattern on the transparent substrate. That is to prevent impurities deriving from the formation of the photocatalyst treatment layer side light shielding part from affecting the photocatalyst.

In the above mentioned invention, it is preferable that the photocatalyst treatment layer is a layer comprising a photocatalyst. That is because when the photocatalyst treatment layer is a layer comprising only the photocatalyst, it is possible to improve decomposing and removing efficiency of the hole injecting layer and to manufacture EL element efficiently.

In the above mentioned invention, it is preferable that the photocatalyst treatment layer is a layer formed by forming a film of the photocatalyst on the substrate by a vacuum film forming method. By forming the photocatalyst treatment layer accordingly by a vacuum film forming method, an uniform photocatalyst treatment layer with few convex-concave on the surface and with even film thickness can be formed which makes it possible to decompose and remove the hole injecting layer in a pattern evenly and efficiently.

In the above mentioned invention, the photocatalyst treatment layer may be a layer comprising the photocatalyst and a binder. By accordingly using the binder, it becomes possible to form the photocatalyst treatment layer relatively easy.

In the above mentioned invention, it is preferable that the photocatalyst is one kind or two or more kinds of substances selected from titanium oxide ($TiO_2$), zinc oxide (ZnO), stannic oxide ($SnO_2$), strontium titanate ($SrTiO_3$), tungsten oxide ($WO_3$), bismuth oxide ($Bi_2O_3$) and iron oxide ($Fe_2O_3$). Among the above, it is particularly preferable that the photocatalyst is titanium oxide ($TiO_2$). That is because band gap energy of the titanium dioxide is high, it is effective as a photocatalyst, and also, it is chemically stable, without toxicity, and easily obtained.

In the above mentioned invention, it is preferable that in irradiation with energy in the decomposition removing process, the gap between the photocatalyst treatment layer and the hole injecting layer is in a range of 0.2 $\mu$m to 10 $\mu$m. Since the gap between the photocatalyst treatment layer and the hole injecting layer is in a range of 0.2 $\mu$m to 10 $\mu$m, the hole injecting layer can be decomposed and removed in a pattern by irradiating energy for a short time.

In the above mentioned invention, it is preferable that the light emitting layer forming process is a process of coating a light emitting layer forming coating solution on the hole injecting layer by an ink jet method. By coating by the ink jet method, the light emitting layer can be formed in high precision and in high efficiency.

Moreover, the present invention provides an EL element comprising at least a substrate, a first electrode layer formed in a pattern on the substrate surface, a hole injecting layer, formed on the first electrode layer, which can be decomposed and removed by the action of a photocatalyst in irradiation with energy, a light emitting layer formed on the hole injecting layer, and a second electrode layer formed on the light emitting layer. As mentioned above, since the EL element of the present invention uses the hole injecting layer which can be decomposed and removed by the action of the photocatalyst in irradiation with energy, the hole injecting layer can be patterned easily by irradiating energy via the photocatalyst. Therefore, it is possible to use the layer-by-layer self-assembled film, which was conventionally difficult to use, as the hole injecting layer so that the EL element with excellent light emitting efficiency can be formed.

In the above mentioned invention, it is preferable that a liquid repellent convex part is formed in between the first electrode layers. By comprising the liquid repellent convex part in between the first electrode layers, it is easy to pattern the light emitting layer so that the higher precision EL element can be formed.

In the above mentioned invention, it is preferable that the hole injecting layer is a layer-by-layer self-assembled film consisting of a cationic polymer and an anionic polymer. That is because the light emitting efficiency can be improved.

According to the present invention, patterning is done by irradiating energy via the photocatalyst treatment layer after forming the hole injecting layer, on the entire surface, which can be decomposed and removed by the action of a photocatalyst in irradiation with energy. And also, since the hole injecting layer surface has better wettability compared to the surface which is bared by the removal of the hole injecting layer, it becomes possible to coat the light emitting layer forming coating solution only onto the hole injecting layer by, for example, the ink jet method. From the above, the present invention has an effect that it relatively easy to pattern the hole injecting layer and the light emitting layer formed thereon.

DESCRIPTION OF PREFERRED EMBODIMENTS

Figure 1A:
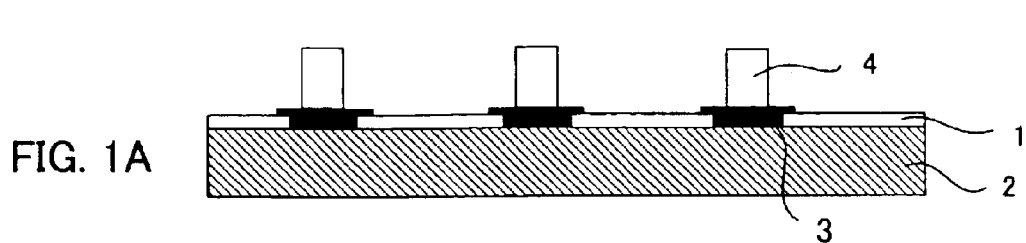
FIGS. 1A, 1B, 1C, 1D, 1E, and 1F are process views showing one example of the method for manufacturing an EL element of the present invention.

Hereinafter, the method for manufacturing EL element and EL element of the present invention will be illustrated respectively.

I. Method for Manufacturing EL Element

The method for manufacturing an EL element of the present invention comprises at least:

a hole injecting layer forming process of forming a hole injecting layer, which can be decomposed and removed by the action of a photocatalyst in irradiation with energy, on a first electrode layer formed side surface of a base material with the first electrode layer formed on the surface in a pattern;

a decomposition removing process of using a photocatalyst treatment layer substrate having at least a photocatalyst treatment layer containing a photocatalyst formed on a substrate, placing the base material with the hole injecting layer formed thereon and the photocatalyst treatment layer substrate with a gap of 200 μm or less so that the photocatalyst treatment layer substrate and the hole injecting layer are facing to each other, and then, decomposing and removing the hole injecting layer in between the first electrode layers, in a pattern, on the base material with the hole injecting layer formed thereon by irradiating with energy from predetermined direction;

a light emitting layer forming process of forming the light emitting layer on the pattern formed hole injecting layer remaining on the base material; and a second electrode layer forming process of forming the second electrode layer on the light emitting layer;

wherein a contact angle to a liquid of the surface of the hole injecting layer is smaller than the contact angle to a liquid of the surface bared by removing the hole injecting layer in the decomposition removing process.

Among the above, the present invention is strongly characterized by the points that the hole injecting layer which can be decomposed and removed by the action of a photocatalyst in irradiation with energy is provided, and the point that contact angle to a liquid of the hole injecting layer surface is smaller than contact angle to a liquid of the surface which is bared by the removal of the hole injecting layer in the decomposition removing process.

As mentioned above, the hole injecting layer which can be decomposed and removed by the action of a photocatalyst in irradiation with energy, the hole injecting layer can be patterned easily by irradiating energy via the photocatalyst treatment layer, even in a case where the hole injecting layer is formed on the entire surface of the base material. Therefore, patterning can be done easily even in a case where a material, which the patterning was difficult by a conventional patterning using a photoresist or the like, is used for the hole injecting layer.

Moreover, since the hole injecting layer surface has better wettability compared to the part which is bared by the decomposition and removal, when the light emitting layer is formed in subsequent processes, for example by the ink jet method, the ink can be coated precisely so that the EL element with high yield and high precision can be manufactured.

The method for manufacturing the EL element of the present invention will be described specifically referring to the figures.

FIGS. 1A, 1B, 1C, 1D, 1E, and 1F are showing one example of the method for manufacturing an EL element of the present invention. First, as shown in FIG. 1A, an insulating layer 3 is formed in between the first electrode layers 1 which are formed in a pattern of the base material 2, and the liquid repellent convex part 4 is formed on the insulating layer 3. The insulating layer 3 is formed so as to cover the edge part of the first electrode layer 1. The liquid repellent convex part 4 is formed by forming a mixture, wherein a material having liquid repellency is mixed into a light sensitive resin with no liquid repellency, on the entire surface of the base material by a wet method, and patterning by the photolithography so that the width of the liquid repellent convex part is narrower than the width in between the transparent electrode layers 1. The reason of making the width of the liquid repellent convex part 4 narrower than the width in between the transparent electrode layers 1 is that when the width in between the first electrode layers 1 and the width of the liquid repellent convex part 4 are same width, there is a possibility that the width of the hole injecting layer is smaller than the width in between the first electrode layers after the below mentioned hole injecting layer removing process, and that a possibility that the first electrode layer is bared and a leak between the electrodes may occur.

Figure 1B:
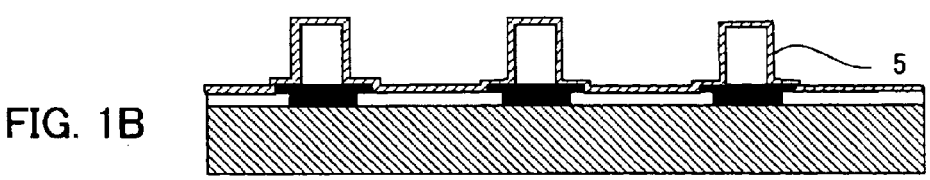

On such a substrate where the liquid repellent convex part 4 is formed, silane coupling treatment is carried out according to the need, and then, the hole injecting layer 5 is formed by the layer-by-layer self-assembling method. The hole injecting layer 5 is formed by repeating processes of immersing the base material 2 surface into an anionic polymer electrolytic aqueous solution, and then, immersing into a cationic polymer electrolytic aqueous solution, for a predetermined times (FIG. 1B).

Figure 1C:
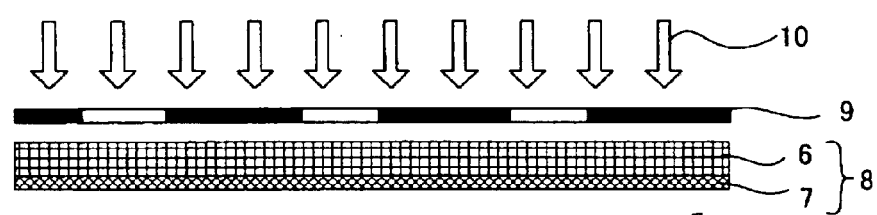
Figure 1D:
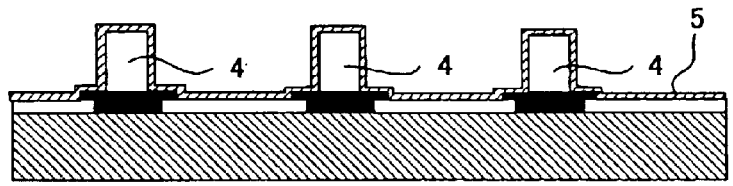

Next, as shown in FIG. 1C, an ultraviolet ray 10 is irradiated via the photocatalyst treatment layer 8, which is the photocatalyst treatment layer 7 formed on the substrate 6, and the photomask 9. In this case, openings of the photomask are formed so that the regions where the liquid repellent convex part 4 exist are irradiated with the ultraviolet ray 10. By doing so, as shown in FIG. 1D, only the hole injecting layer 5 surrounding the liquid repellent convex part 4 is decomposed and removed by the action of the photocatalyst in the photocatalyst treatment layer 7, and the liquid repellent convex part 4 is bared.

Figure 1E:
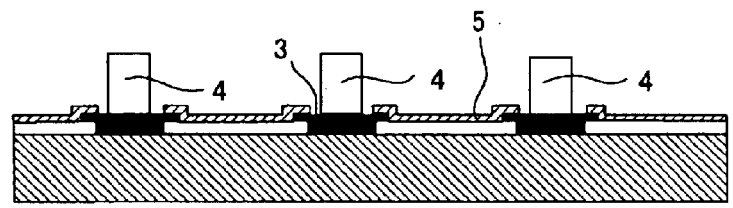

Then, as shown in FIG. 1E, the light emitting layer 13 is formed on the hole injecting layer 5 by coating the light emitting layer forming coating solution 12 on the part of the first electrode layer 1 where the hole injecting layer 5 remains by using an ink jet apparatus 11, and curing or drying the above.

Then, the EL element is formed by forming a second electrode layer, a gas barrier layer, or the like thereon.

Hereinafter, each process of the method for manufacturing EL element of the present invention will be explained in detail.

A. Hole Injecting Layer Forming Process

First, the hole injecting layer forming process in the present invention will be explained. The hole injecting layer forming process in the present invention is a process of forming the hole injecting layer which can be decomposed and removed by the action of a photocatalyst in irradiation with energy, on the first electrode layer formed side surface of the base material having the first electrode layer formed in a pattern on the surface. For example, it is a process of forming the hole injecting layer 5 as shown in FIG. 1B, on the base material 2 comprising the first electrode layer 1 formed in a pattern, the insulating layer 3 formed so as to cover the edge part of the first electrode layer 1, and liquid repellent convex part 4 formed on the insulating layer 3, as shown in FIG. 1A.

Since the hole injecting layer of the present invention has better wettability than the surface which is bared when decomposed and removed in the below mentioned decomposition and removing process, for example, the liquid repellent convex part, the insulating layer, or the like, the light emitting layer can be formed in a pattern easily on the hole injecting layer by using for example the ink jet method in the subsequent light emitting layer forming process.

Hereinafter, the hole injecting layer formed in the present process and other layers constituting the present process will be described.

(1) Hole Injecting Layer

First, a hole injecting layer will be described. The hole injecting layer in the present invention is a layer in which the parts irradiated with energy are decomposed and removed by the action of a photocatalyst in the photocatalyst treatment layer when irradiated with energy, and a layer wherein the contact angle to a liquid of the hole injecting layer manifests smaller wettability than the contact angle to a liquid of the bared layer when decomposed and removed.

With such the hole injecting layer, a pattern composed of parts with the hole injecting layer and parts without the hole injecting layer can be formed without conducting a developing process or cleaning process, since parts irradiated with energy are decomposed and removed by the action of the photocatalyst.

This hole injecting layer is decomposed by oxidation and vaporized or the like by the action of the photocatalyst by irradiation with energy, therefore, removed without special post treatment such as a developing process, cleaning process or the like. However, a cleaning process or the like may be conducted depending on the material of the hole injecting layer.

In the present invention, since the light emitting layer is patterned on the hole injecting layer by using the hole injecting layer formed into a pattern, utilizing the wettability difference of the hole injecting layer and the layer which is bared by the decomposition removal of the hole injecting layer, it is constituted so that the contact angle to a liquid of the hole injecting layer is smaller than the contact angle to a liquid of a layer which is bared by the decomposition and removal of this hole injecting layer, such as the contact angle to a liquid of the insulating layer, the liquid repellent convex part, or the like. By doing so, the light emitting layer is formed in a high precision pattern on the hole injecting layer, the holes are stably injection transported from the first electrode layer by the function of the first electrode layer, and the EL element excellent in light emitting efficiency can be obtained.

Further, the wettability of the hole injecting layer is not particularly limited as long as the contact angle to a liquid of the hole injecting layer surface is smaller than the contact angle to a liquid of a layer bared by the decomposition removal of the hole injecting layer (for example, the liquid repellent convex part or the insulating layer when the liquid repellent convex part or the insulating layer is provided, or the substrate or the like when the liquid repellent convex part and the insulating layer are not provided). The reason for this is that, by this, the light emitting layer forming coating solution which forms the light emitting layer scarcely adheres on the surface of the base material, the insulating layer, or the liquid repellent convex part, and can successfully adhere on the hole injecting layer.

Specifically, it is preferable that the contact angle of the hole injecting layer to a liquid having surface tension equivalent to the surface tension of the light emitting layer forming coating solution to be coated is smaller than that of a layer bared by decomposition and removal of the hole injecting layer such as the liquid repellent convex part, the insulating layer, the substrate, or the like by 1° or more, particularly 5° or more, especially 10° or more.

In such a case, the lyophilic required for the surface of the hole injecting layer is preferably a layer whose the contact angle to a liquid having surface tension equivalent to the surface tension of the light emitting layer forming coating solution to be coated is 30° or less, preferably 20° or less, particularly preferably 10° or less.

The contact angle to liquid here referred to is obtained by measuring contact angle to a liquid having various surface tensions by a contact angle measuring apparatus (CA-Z type, manufactured by Kyowa Interface Science Co., LTD.) (30 seconds after dropping droplets from a micro syringe), or drawing a graph using the results. In its measurement, wetting index standard solution manufactured by JUNSEI CHEMICAL CO., LTD. was used as the liquid having various surface tensions.

The thickness of the hole injecting layer in the present invention is not particularly limited as long as it can be decomposed and removed by the action of a photocatalyst in irradiation with energy, in the decomposition removing process of the hole injecting layer described later. Specifically, the thickness is preferably in a range of 0.001 μm to 1 μm, particularly preferably in a range of 0.01 to 0.1 μm.

The material for forming the hole injecting layer in the present invention is not particularly limited as long as it is a material which has a hole injection transporting property and also, it is a material which is decomposed and removed by the action of the photocatalyst contained in the photocatalyst treatment layer placed with a predetermined gap to the hole injecting layer when irradiating with energy, the hole injecting layer plays a role in injecting and transporting holes stably into the light emitting layer.

The method of forming such a hole injecting layer is not particularly limited as long as it is a method capable of forming the hole injecting layer on the entire surface of the substrate. Specifically, methods for coating such as a spin coating method, casting method, dipping method, bar coating method, blade coating method, roll coating method, gravure coating method, flexo printing method, spray coating method, and the like, and methods for forming a film such as self-assembled monolayer, Langmuir Blodgett film, layer-by-layer self-assembled film, and the like can be listed. Among the above, the method for forming film such as self-assembled monolayer, Langmuir Blodgett film, and layer-by-layer self-assembled film are preferable because they are reliable as a thin layer, and relatively strong thin films can be formed by those methods. Particularly among the above, it is the most preferable that the method for forming a film is a layer-by-layer self-assembled film. The reason is because the method for forming by the layer-by-layer self-assembled film has a structure which different materials are laminated and electric property is controlled spatially so that it manifests carrier trapping effect and the light emitting efficiency can be improved.

Hereinafter, layer-by-layer self-assembled film, self-assembled monolayer, and Langmuir Blodgett film used in the present invention are specifically described.

① Layer-By-Layer Self-Assembled Film

The layer-by-layer self-assembled film is, in general, a film formed by laminating by adsorption and bonding of materials having a functional group with at least two positive or negative charges sequentially on a base material. Since a material having a lot of functional groups has a lot of merits such as increase in the strength, durability of a film, and the like, ionic polymers (polymer electrolyte) are recently used as the material in many cases. Particles having a surface charge such as proteins, metals, oxides, and the like, what is called "colloid particles" are also used as the film formation substance frequently. Further recently, there are also reports on films positively utilizing mutual action weaker than ionic bond such as hydrogen bond, coordinate bond, hydrophobic mutual action and the like. Examples of the layer-by-layer self-assembled film found relatively recently are described in detail in review of Paula T. Hammond, "Recent Explorations in Electrostatic Multilayer Thin Film Assembly", Current Opinion in Colloid & Interface Science, 4, 430–442 (2000), though they are somewhat biased to materials in which electrostatic mutual action is utilized as driving force.

Among the above, the layer-by-layer self-assembled film in the present invention is preferably consisting of a cationic polymer and an anionic polymer. These cationic polymer and anionic polymer are nor particularly limited as long as they can be laminated by the layer-by-layer self-assembling method. As specific examples of the cationic polymer, polyallylamine hydrochloride, polyhexadiamine, poly-p-xylylene-tetrahydrothiophenium, and the like can be listed. On the other hand, as the anionic polymer, complex of polyethylenedioxythiophene/polystyrenesulfonate (PEDOT/PSS), sulfonated polyaniline, polystyrene sulfonic acid, polymethacrylic acid, and the like can be listed.

Furthermore in the present invention, in the hole injecting layer formed by laminating the above mentioned materials, the uppermost layer, that is, the film of the hole injecting layer which directly contact to the light emitting layer, is preferably a film comprising a semiconductor polymer or an insulating polymer. That is because when they are used as an EL element, since electrons injected from cathode side are blocked by the uppermost film of semiconductor or insulating polymer and are accumulated in the light emitting layer, these electrons and holes injected from anode side will bond efficiently so that the light emitting efficiency can be improved.

Describing the layer-by-layer self-assembled film by using the simplest process as an example, it is a film laminated by repeating, for predetermined times, a cycle of adsorption of a material having a positive (negative) charge-cleaning-adsorption of a material having a negative (positive) charge-cleaning. An operation of development-condensation-transfer like in the case of a below mentioned Langmuir Blodgett film is not necessary at all. Further, the layer-by-layer self-assembled film does not have, in general, two-dimensional high alignment property and high order property as in the below mentioned Langmuir Blodgett film. However, the layer-by-layer self-assembled film has a lot of merits not found in conventional film formation methods, such as easy formation of a dense film without defect, uniform film formation even on a fine irregular surface, inner surface of tube, spherical surface and the like.

In order to form the hole injecting layer by laminating the above mentioned cationic polymer and anionic polymer on the entire surface of the base material by the layer-by-layer self-assembling method, a surface treatment to charge the surface, before laminating the hole injecting layer by the layer-by-layer self-assembling method, with positive or negative, that is, a silane coupling treatment is preliminary carried out. As such a silane coupling treatment, for example, a coupling layer whose end is substituted with amino group ($NH_2$) is formed on the entire surface of the base material, and then, the amino group is substituted so that the end amino group is charged in positive. The reaction of the above is shown in the below chemical formula.

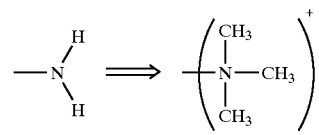

A treatment of forming a coupling layer which the base material surface is charged in positive by above mentioned reaction can be listed as an example of a silane coupling treatment.

Silane coupling materials used in such silane coupling treatment is not particularly limited as long as the end group is an amino group ($-NH_2$) or a thiol group ($-SH$). In the present invention, commercially available silane coupling materials can be used. For example, 3-aminopropyl trimethoxy silane, and 3-aminopropyl triethoxy silane can be listed as end amino groups, and 3-mercaptopropyl methyldimethoxy silane, 3-mercaptopropyl trimethoxy silane, and the like can be listed as end thiol groups.

② Self-Assembled Monolayer

Though the inventors do not know the presence of the official definition of a self-assembled monolayer, review of "Formation and Structure of Self-Assembled Monolayers", by Abraham Ulman, Chemical Review, 96, 1533–1554 (1996), for example, is excellent as description of which is recognized generally as a self-assembled monolayer. Referring to this review, it can be concluded that the self-assembled monolayer is a single molecule layer obtained as a result of adsorption and bonding (self-assembling) to the surface of a suitable base material of suitable molecules. As the material having an ability of forming a self-assembled film, for example, surfactant molecules such as fatty acids and the like, organosilicon molecules such as alkyltrichlorosilanes, alkylalkoxides and the like, organic sulfur molecules such as alkanethiols and the like, organic phosphoric acid molecules such as alkylphosphates and the like are listed. The general common property of the molecule structure is that they have a relatively long alkyl chain, and a functional group, which acts mutually with the surface of a base material, is present on the one end of a molecule. A portion of an alkyl chain is source of intermolecular force when molecules pack tow-dimensionally. However, the example shown here is the most simple structure, and there are reported self-assembled monolayers composed of various molecules such as those having a functional group such as an amino group, carboxyl group and the like on another end of a molecule, those in which the part of an alkylene chain is an oxyethylene chain, a fluorocarbon chain, those having a type of chain obtained by combination thereof, and the like. There is also a self-assembled monolayer of composite type composed of a plurality of molecular species. Further, recently, one layer of a polymer in the form of particle and having a plurality of functional groups (there may be only one functional group, in some cases) as typified by a dendrimer, or a linear (in some cases, branched) polymer is formed on the surface of a base material (the latter is generically called as polymer brush) are considered as a self-assembled monolayer, in some cases. In the present invention, these are also included in the self-assembled monolayer.

③ Langmuir Blodgett Film

The form of the Langmuir Blodgett film used in the present invention has no significant difference from the above mentioned self-assembled monolayer, once they are formed on a base material. It can be concluded that the feature of the Langmuir Blodgett film resides in its formation method and a high two-dimensional molecule packing property (high alignment property, high order property) derived from the method. Namely, in general, Langmuir Blodgett film forming molecules are developed first on the gas-liquid interface, and the developed film is condensed by trough to be changed into a highly packed condensed film. Actually, this is transferred onto a suitable base material and used. By the method outlined here, a single molecule film and also a multi-layer film made of optional molecule layers can be formed. Not only low weight molecules, but also polymers, colloid particles and the like can be used as the film material. Recent examples using various materials are described in detail in review of Tokuji Miyashita, et al., "Vision of nano-technology for soft type nano-device production", POLYMER, vol. 50, no. 9, 644–647 (2001).

(2) Liquid Repellent Convex Part

In the present invention, it is preferable that the liquid repellent convex part is provided in between the first electrode layers on the base material before the above mentioned hole injecting layer is formed. By providing the liquid repellent convex part, a clear wettability difference from the hole injecting layer formed on the first electrode layer is formed, and also has a function as a partition which prevents a mixture of the light emitting layer forming coating solution between the adjacent pixels in the below mentioned light emitting layer forming process, therefore, formation of the light emitting layer will be easy.

Such liquid repellent convex part is not particularly limited as long as the liquid repellent convex part surface at least retains liquid repellency, and manifests enough liquid repellency to the light emitting layer forming coating solution which forms the light emitting layer. Hereinafter, the above mentioned liquid repellent convex part in the present invention is explained in detail.

① Liquid Repellency of the Liquid Repellent Convex Part Surface

In the liquid repellent convex part in the present invention, it is preferable that the contact angle of the liquid repellent convex part to a liquid having surface tension equivalent to the surface tension of the light emitting layer forming coating solution to be coated is larger than that of the hole injecting layer by 1° or more, particularly 5° or more, especially 10° or more.

In such a case, as the liquid repellency required for the surface of the liquid repellent convex part, the contact angle to a liquid having surface tension equivalent to the surface tension of the light emitting layer forming coating solution to be coated is preferably 30° or more, preferably 40° or more, particularly preferably 50° or more.

The contact angle to liquid here referred to is the same as that described in the above mentioned column of the hole injecting layer, therefore, description is omitted here.

As methods for imparting liquid repellency within the above mentioned range to the liquid repellent convex part, in one case, the liquid repellent convex part is formed with materials retaining liquid repellency, and in another case, the liquid repellent convex part is formed with widely used resins and the liquid repellency is imparted by a surface treatment. Hereinafter, each method is explained.

a. Method for Forming the Liquid Repellent Convex Part with a Material Having Liquid Repellency As materials for forming the liquid repellent convex part, liquid repellency is imparted to the liquid repellent convex part surface by selecting a resin material itself in some cases, or liquid repellency is imparted by introducing an additive to a resin material in other cases.

In the first place, as materials which resin material itself has liquid repellency, fluorine type resins such as polytetrafluoroethylene (PTFE), silicone type resins, and the like can be listed.

In the present invention, liquid repellency may be imparted by forming the liquid repellent convex part with the above mentioned materials only, or may be used as a mixture with other commonly used materials. The blending ratio, in this case, is optionally adjusted so that the resin material after mixing satisfy the above mentioned wettability conditions. When Modiver F200 (manufactured by NOF Corporation) is used as an additive, it is preferable to add by 10 wt % though a resin is manifested by mixing 1 wt % to a resin.

Moreover, an additive which improves liquid repellency of the liquid repellent convex part surface, which is formed with the resin material, by adding to a resin material is not particularly limited as long as the material dose not affect the hole injecting layer, light emitting layer, and the like. Specifically, fluorine type resins, silicone type resins, copolymer oligomers and the like mainly composed of perfluoro alkyl group containing acrylate or methacrylate can be listed. Among the above, copolymer oligomers mainly composed of perfluoro alkyl group containing acrylate or methacrylate are preferably used. Further, as commercially available products, Surfron (random type oligomer; manufactured by Seimi Chemical Co., Ltd.), Aron G (graft type oligomer; manufactured by Toagosei Co., Ltd.), Modiver F (block type oligomer; manufactured by NOF Corporation), and the like can be listed.

Adding amount of these additives to resin materials differ greatly depending on types of the additives and the types of the resins. However, it is preferable that additives are used in a range of 0.001 wt % to 10 wt % to the solid part of the resin materials to be used, more preferably in a range of 0.01 wt % to 5 wt %.

In the present invention, the above mentioned liquid repellency imparting additives may further be added according to the need, even in the case where resin material itself is a material having liquid repellency.

In these liquid repellent convex part which are formed with such materials, there is a possibility that liquid repellency of the surface is lost when energy is irradiated in the below mentioned decomposition removing process. However in such case, liquid repellency may be restored because liquid repellent material contained in the inner part will be moved to the surface by heating treatment. The temperature of the heating treatment is preferably in a range of 50° C. to 250° C., more preferably in a range of 80° C. to 200° C.

b. A Case where Liquid Repellency is Imparted by Surface Treatments

The treating methods to give liquid repellency to the liquid repellent convex part surface are not particularly limited. For example, it may be a method to treat the surface, in a pattern, with liquid repellent treatment agent such as silicone compounds and fluorine containing compounds.

Moreover in the present invention, surface treatment using plasma of fluorocarbon gas may be used.

The organic substance part can be liquid repellent treated selectively by the surface treatment using plasma of fluorocarbon gas. That is because when the fluorocarbon gas is used, it reacts only with organic substances so that only the organic substance part will be treated selectively. Therefore, when the liquid repellent convex part is formed with organic substances, only the predetermined area can be made liquid repellent by carrying out the surface treatment via a mask.

As treatment using the plasma of this fluorocarbon, a substrate was placed in a chamber and vacuumed, and then $CF_4$ was introduced (flow rate: 50 sccm) and inside was maintained at constant pressure (150 Torr), with RF power of 150 W, plasma treatment was carried out for about 5 minutes. For dry etching apparatus to be used, DEA-506T (manufactured by Anelva Corporation) and the like can be listed as an example.

In the present invention, $CF_4$, $C_2F_6$, $C_3F_8$, c-$C_4F_8$, $CCl_2F_2$, $CClF_3$, $C_2Cl_2F_4$, $C_2ClF_5$, $CBrF_3$, $CHF_3$, $C_2H_3F_3$, $CH_3CHF_2$, $NF_3$, $SF_6$, and the like can be used as the fluorocarbon gases. Among the above, $CF_4$ gas is preferably used.

Moreover, it is preferable that a surface treatment using plasma of oxygen gas is applied in advance, when carrying out the surface treatment using the plasma of fluorocarbon gas. By making the substrate surface lyophilic by surface treatment using the plasma of oxygen gas, and then carrying out the surface treatment using the plasma of fluorocarbon gas to the liquid repellent convex part surface via a mask, a wettability difference can be larger and adhesion of the light emitting layer forming coating solution to the liquid repellent convex part surface can be prevented more efficiently.

Conventionally used resin materials can be used as materials for forming the liquid repellent convex part in this case. The above mentioned resin materials are not particularly limited as long as they are insulating materials, for example, novolak type resins, polyimide, and the like can be listed.

② Method for Forming the Liquid Repellent Convex Part

A method for forming the liquid repellent convex part used in the present invention is, for example, a liquid repellent convex part material layer is formed on the base material, a photoresist mask is formed thereon which a predetermined shape of the liquid repellent convex part can be formed by a photolithography method, and the liquid repellent convex part is formed by a dry etching method or by a wet etching method.

It is preferable that a width of accordingly formed liquid repellent convex part is narrower than the clearance in between the first electrode layers. For example, if the width of the liquid repellent convex part is equal to the clearance in between the first electrode layers, the width of the hole injecting layer may be much narrower than the width of the first electrode layer when the hole injecting layer is formed in a pattern in the below mentioned decomposition removing process. That is, because the end part of the first electrode layer is bared, the first electrode layer and the second electrode layer are conducted, causing inconvenience such as short circuit. Therefore in the present invention, by forming the width of the liquid repellent convex part narrower than the clearance in between the first electrode layer, the width of the pattern formed hole injecting layer is not patterned narrower than the first electrode layer, thus the above mentioned inconvenience is solved.

Furthermore, a thickness of the liquid repellent convex part is not particularly limited as long as it can act as a partition to prevent the mixture of the light emitting layer forming coating solution between the adjacent pixels in the below mentioned light emitting layer forming process. Specifically, the thickness is preferably 0.5 $\mu$m or more, more preferably in a range of 1.0 $\mu$m to 10.0 $\mu$m.

(3) First Electrode Layer

In the present invention, the above mentioned hole injecting layer is formed in a pattern on the first electrode layer. These materials for forming this first electrode layer are not particularly limited as long as they have conductivity. As such material, for example, a transparent electrode of In—Zn—O (IZO), In—Sn—O (ITO), ZnO—Al, Zn—Sn—O and the like are preferable since those having transparency are preferable when in the EL element shown in FIG. 1F, light is taken from the lower direction of the figure, and when, in a decomposition removing process described later, energy is irradiated from the lower direction of FIG. 1C. On the other hand, in the EL element shown in FIG. 1F, when light is taken from the upper direction of the figure, it is also possible to use an electrode made of a metal since transparency is not particularly required. Specifically, Au, Ta, W, Pt, Ni, Pd, Cr and Al alloy, Ni alloy, Cr alloy and the like are listed.

(4) Base Material

In the present invention, EL element is formed on the base material. It is preferable that the substrate is transparent in the case of, in EL element shown in FIG. 1F, light is taken from the lower direction, or in the case of irradiation with energy from the lower direction of FIG. 1C in a decomposition removing process described later. Specifically, quarts, glass and the like are listed. In the EL element shown in FIG. 1F, when light is taken from the upper direction, transparency is not particularly required, therefore, in addition to the above mentioned material, metals such as aluminum, alloys thereof and the like, plastics, woven fabrics, non-woven fabrics and the like can be listed.

(5) Insulating Layer

In the present invention, an insulating layer may be provided in advance so that the light emitting portions will be opening parts, in order to cover the end parts of the first electrode layer formed on the base material, and to prevent short circuit in parts those are not necessary for light emitting. By doing as above, defects due to short circuit of elements and the like are reduced, and element with long life and stable light emission can be obtained.

As generally known, these insulating layers can be pattern formed by using, for example, UV curing resin materials and the like. Specifically, novolak type resins, polyimide, and the like can be listed.

B. Decomposition Removing Process

A decomposition removing process in the present invention is a process of using a photocatalyst treatment layer substrate having a photocatalyst treatment layer containing a photocatalyst formed on a substrate, placing the photocatalyst treatment layer and the hole injecting layer with a gap of 200 μm or less, and then, forming the hole injecting layer in a pattern by irradiating with energy in a pattern from predetermined direction so that the region, where the hole injecting layer is decomposed and removed, is irradiated with energy.

Furthermore, liquid repellency of the liquid repellent convex part may be lost by the energy irradiation in the present process, as mentioned above, liquid repellency can be restored apply heat treatment to the liquid repellent convex part after the present process. The heat treatment is same as described in the above column of "Liquid repellent convexpart", description is omitted here.

Hereinafter, photocatalyst treatment layer substrate and the like used in the present process are explained.

(1) Photocatalyst Treatment Layer Substrate

In the present invention, when patterning the hole injecting layer which can be decomposed and removed by the action of a photocatalyst in irradiation with energy, a photocatalyst treatment layer substrate having a photocatalyst treatment layer containing a photocatalyst formed thereon is used for exerting the action of a photocatalyst on the hole injecting layer. The hole injecting layer can be patterned by placing such a photocatalyst treatment layer substrate with a predetermined gap to the hole injecting layer and conducting pattern irradiation with energy.

Such a photocatalyst treatment layer substrate comprises at least a photocatalyst treatment layer and a substrate, and usually, a photocatalyst treatment layer in the form of thin film is formed by a predetermined method on the substrate. As this photocatalyst treatment layer substrate, those having a light shielding part in the form of pattern can be used.

① Photocatalyst Treatment Layer

The photocatalyst treatment layer used in the present invention is not particularly limited as long as it is constituted that a photocatalyst in the photocatalyst treatment layer decomposes and removes the intended hole injecting layer, and the photocatalyst treatment layer may be constituted of a photocatalyst and a binder, or may be formed of a photocatalyst alone. The wettability of it surface may be lyophilic or liquid repellent.

Figure 3:
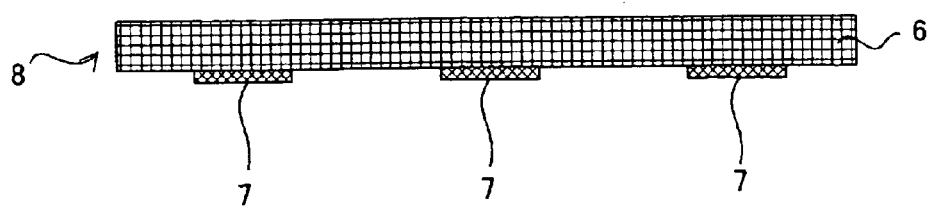
FIG. 3 is a schematic sectional view showing one example of a photocatalyst treatment layer substrate in the present invention.

The photocatalyst treatment layer used in the present invention may be formed on the entire surface of a substrate 6 as shown, for example, in the above mentioned FIG. 1C and the like, or the photocatalyst treatment layer 7 may be formed into a pattern on the substrate 6 as shown, for example, in FIG. 3.

By thus forming a photocatalyst treatment layer into a pattern, there is no need to conduct pattern irradiation using a photomask and the like in irradiating with energy with the photocatalyst treatment layer placed at a predetermined gap to the hole injecting layer, and by irradiating the entire surface, the hole injecting layer can be decomposed and removed.

This patterning method of a photocatalyst treatment layer is not particularly limited, and for example, it can be conducted by a photolithography method and the like.

Since only the hole injecting layer actually facing the photocatalyst treatment layer is decomposed and remoced, energy irradiation may be conducted from any direction as long as parts, where the above mentioned photocatalyst treatment layer and hole injecting layer are facing to each other, are irradiated with energy, further, there is a merit that irradiation energy is not particularly limited to parallel energies such as parallel light and the like.

The acting mechanism of a photocatalyst typified by titanium dioxide described later in such a photocatalyst treatment layer is not necessarily clear, however, it is believed that a carrier produced by irradiation with light effects the chemical structure of an organic substance by a direct reaction with adjacent compounds or by an active oxygen species produced in the presence of oxygen and water. In the present invention, it is believed that this carrier exerts an action on a compound in the hole injecting layer placed near the photocatalyst treatment layer.

As the photocatalyst used in the present invention, those known as a photo-semiconductor, for example, titanium dioxide ($TiO_2$), zincoxide (ZnO), stannicoxide ($SnO_2$), strontiumtitanate ($SrTiO_3$), tungsten oxide ($WO_3$), bismuth oxide ($Bi_2O_3$) and iron oxide ($Fe_2O_3$) are listed, and one kind or two or more kinds of compounds can be selected from them and used.

In the present invention, titanium dioxide is particularly suitably used since it shows high band gap energy, is chemically stable and non-toxic, and easily available. Titanium dioxide includes anatase type and rutile type, and both of them can be used in the present invention, and anatase type titanium dioxide is preferable. The anatase type titanium dioxide has an excitation wavelength of 380 nm or less.

As such anatase type titaniumdioxide, for example, anatase type titania sol of hydrochloric acid peptisation type (STS-02 (average particle size: 7 nm) manufactured by Ishihara Sangyo Kaisha, Ltd., ST-K01 manufactured by Ishihara Sangyo Kaisha, Ltd.), anatase type titania sol of nitric acid peptisation type (TA-15 (average particle size: 12 nm) manufactured by Nissan Chemical Industries, Ltd.) and the like can be listed.

The smaller the particle size of a photocatalyst is, it is preferable since a photocatalyst reaction occurs effectively, and the average particle size thereof is preferably 50 nm or less, and it is particularly preferable to use a photocatalyst having an average particle size of 20 nm or less.

The photocatalyst treatment layer in the present invention may be formed of a photocatalyst alone as described above, or may be formed by mixing with a binder.

In a case of the photocatalyst treatment layer is made only of a photocatalyst, the efficiency of decomposition and removal of the hole injecting layer is improved, being advantageous in terms of cost such as shortening of treatment time and the like. On the other hand, in a case of the photocatalyst treatment layer is made of a photocatalyst and a binder, there is a merit that formation of a photocatalyst treatment layer is easy.

As the method of forming a photocatalyst treatment layer made only of a photocatalyst, vacuum film formation methods such as, for example, a sputtering method, CVD method, vacuum vapor deposition method, and the like can be used. By forming a photocatalyst treatment layer by a vacuum film formation method, a photocatalyst treatment layer of uniform film and containing only a photocatalyst can be obtained, and the hole injecting layer can be decomposed and removed relatively efficiently as compared with the case using a binder.

Moreover, as a method of forming a photocatalyst treatment layer made only of a photocatalyst, when the photocatalyst is titanium dioxide for example, a method in which amorphous titania is formed on a substrate, then, the phase is changed into crystalline titania by calcination, and other methods can be used. The amorphous titania used here can be obtained by, for example, hydrolysis and dehydration condensation of inorganic salts of titanium such as titanium tetrachloride, titanium sulfate and the like, and hydrolysis and dehydration condensation of organic titanium compounds, in the presence of an acid, such as tetraethoxytitanium, tetraisopropoxytitanium, tetra-n-propoxytitanium, tetrabutoxytitanium, tetramethoxytitanium and the like. Next, it can be denatured into anatase type titania by calcination at 400 to 500° C., denatured into rutile type titania by calcination at 600 to 700° C.

Furthermore, when a binder is used, those showing high bonding energy so that the main skeleton of a binder is not decomposed by light excitation of the above mentioned photocatalyst are preferable, and for example, organopolysiloxanes and the like can be listed.

When an organopolysiloxane is used as a binder as described above, the above mentioned photocatalyst treatment layer can be formed by dispersing a photocatalyst and organopolysiloxane as a binder, together with other additives when need, into a solvent to prepare coating solution, and coating this coating solution on a substrate. The solvent used is preferably an alcohol type organic solvent such as ethanol, isopropanol and the like. Coating can be conducted by a known coating method such as spin coating, spray coating, dip coating, roll coating, bead coating and the like. When an ultraviolet curing type component is contained as a binder, a photocatalyst treatment layer can be formed by conducting a curing treatment by irradiating with ultraviolet ray.

As the binder, an amorphous silica precursor can be used. This amorphous silica precursor is preferably silicon compounds represented by the general formula $SiX_4$ wherein X represents a halogen, methoxy group, ethoxy group, acetyl group, and the like, silanols which are hydrolyzates thereof, or polysiloxanes having an average molecular weight of 3000 or less.

Specifically, tetraethoxysilane, tetraisopropoxysilane, tetra-n-propoxysilane, tetrabutoxysilane, tetramethoxysilane and the like can be listed. In this case, a photocatalyst treatment layer can be formed by uniformly dispersing a precursor of amorphous silica and particles of a photocatalyst in a non-aqueous solvent, hydrolyzing them with water in air to form a silanol on a substrate, then, dehydration-polycondensing it at normal temperature. When the dehydration-polycondensation of a silanol is conducted at 100° C. or more, the degree of polymerization of a silanol can be increased, and the strength of the surface of a film can be improved. These binding agents can be used alone or in admixture of two or more kinds.

The content of a photocatalyst in a photocatalyst treatment layer when a binder is used can be set in a range of 5 to 60 wt %, preferably in a range of 20 to 40 wt %. The thickness of a photocatalyst treatment layer is preferably in a range of 0.05 to 10 μm.

Furthermore, the photocatalyst treatment layer can contain a surfactant in addition to the above mentioned photocatalysts and binders. Specifically, hydrocarbon based surfactants such as NIKKOL BL, BC, BO, BB series manufactured by Nikko Chemicals Co., Ltd., fluorine based or silicone based nonionic surfactants such as ZONYL FSN, FSO manufactured by Du Pont Kabushiki Kaisha, Surflon S-141, 145 manufactured by Asahi Glass Company, Megafack F-141, 144 manufactured by Dainippon Ink and Chemicals, Incorporated, Futargent F-200, F251 manufactured by Neos, Unidyne DS-401, 402 manufactured by DAIKIN INDUSTRIES, Ltd., Ltd., Fluorad FC-170, 176 of 3 M K.K. and the like can be listed, and cationic surfactants, anionic surfactants and ampholytic surfactants can be also used.

Further, the photocatalyst treatment layer can contain oligomers, polymers and the like of polyvinyl alcohol, unsaturated polyesters, acrylic resins, polyethylene, diallyl phthalate, ethylene propylene diene monomer, epoxy resins, phenol resins, polyurethane, melanine resins, polycarbonates, polyvinyl chloride, polyamides, polyimides, styrene butadiene rubber, chloroprene rubber, polypropylene, polybutylene, polystyrene, polyvinyl acetate, polyesters, polybutadiene, polybenzimidazole, polyacrylonitrile, epichlorohydrin, polysulfide, polyisoprene and the like, in addition to the above mentioned surfactants.

② Substrate

In the present invention, the photocatalyst treatment layer substrate comprises at least a substrate and a photocatalyst treatment layer formed on this substrate.

In this case, the transparency of a material constituting a substrate used is appropriately selected depending on the direction of irradiation with energy, and the direction of taking out light from the resulting EL element, described later.

Figure 1F:
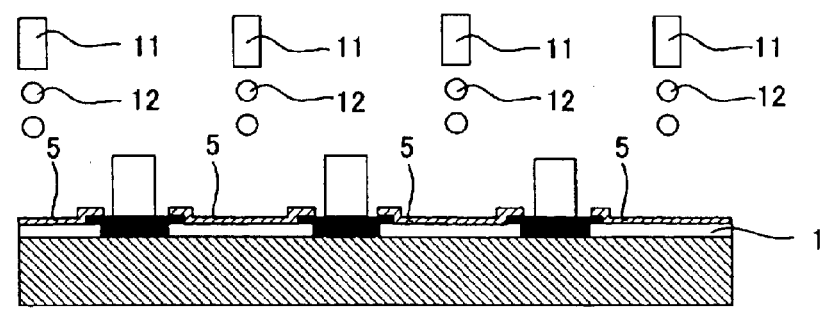
Figure 1F:
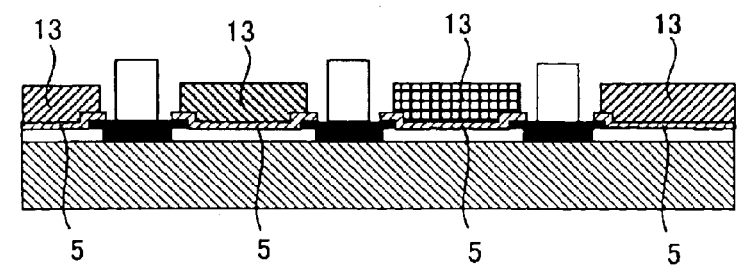

Namely, when the EL element shown in FIG. 1F is an EL element which light is taken out from the upper side, and the lower side of the EL element shown in FIG. 1F is non-transparent, the energy irradiation direction is necessarily from the side of a photocatalyst treatment layer substrate, and as shown in FIG. 1C, it is necessary to place a photomask 9 on the side of a photocatalyst treatment layer substrate 8 and irradiate with energy. Further, also when a light shielding part is previously formed into the predetermined pattern on a photocatalyst treatment layer substrate and a pattern is formed by using this light shielding part as described later, it is necessary to conduct irradiation with energy from the photocatalyst treatment layer substrate side. In such a case, it is necessary that the substrate has transparency.

On the other hand, when the EL element shown in FIG. 1F is of type which light is taken out from the lower side, and the lower side of the EL element shown in FIG. 1F is transparent, it is possible to place a photomask on the base material 2 side and to conduct energy irradiation, therefore, in such a case, the substrate is not required to be transparent.

The substrate used in the present invention may have flexibility, or for example, may be a resin film and the like, or may have no flexibility, for example, a glass substrate and the like.

As described above, the material of the substrate used in a photocatalyst treatment layer substrate in the present invention is not particularly limited, however, in the present invention, this photocatalyst treatment layer substrate is used repeatedly, therefore, a material having predetermined strength and having a surface excellent in close adherence with a photocatalyst treatment layer is suitably used.

Specifically, glass, ceramics, metals, plastics and the like can be listed.

For improving the close adherence of the surface of a substrate with a photocatalyst treatment layer, an anchor layer maybe formed on a substrate. As such an anchor layer, for example, silane based, titanium based coupling agents, and the like can be listed.

③ Light Shielding Part

As the photocatalyst treatment layer substrate used in the present invention, the one which has a light shielding part formed into a pattern may also be used. By using a photocatalyst treatment layer substrate having such a light shielding part, it is not necessary to use a photomask, or to conduct drawing irradiation with laser light, in energy irradiation. Therefore, since positioning of a photocatalyst treatment layer substrate with a photomask is not necessary, the process can be simplified, and since an expensive apparatus necessary for drawing irradiation is also not necessary, there is a merit of advantage in cost.

The photocatalyst treatment layer substrate having such a light shielding part can include the following two embodiments depending on the formation position of the light shielding part.

Figure 4:
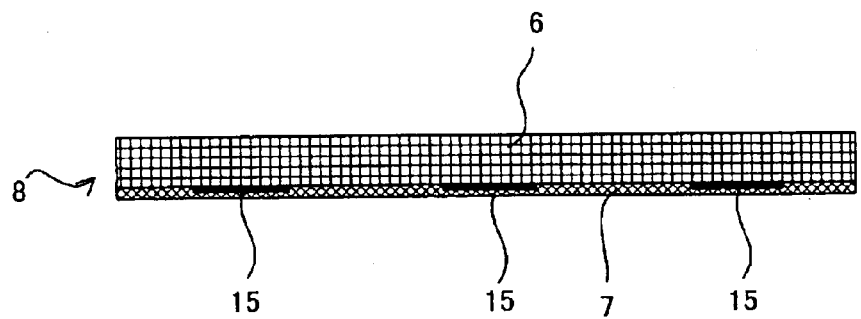
FIG. 4 is a schematic sectional view showing another example of a photocatalyst treatment layer substrate in the present invention.
Figure 5:
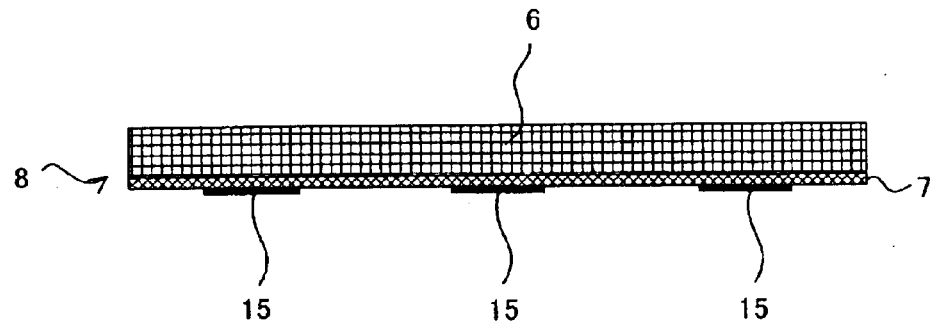
FIG. 5 is a schematic sectional view showing another example of a photocatalyst treatment layer substrate in the present invention.

One is an embodiment in which, as shown in FIG. 4 for example, a light shielding part 15 is formed on a substrate 6, and a photocatalyst treatment layer 7 is formed on this light shielding part 15, to give a photocatalyst treatment layer substrate 8. Another is an embodiment in which, as shown in FIG. 5 for example, a photocatalyst treatment layer 7 is formed on a substrate 6, and a light shielding part 15 is formed thereon, to give a photocatalyst treatment layer substrate 8.

In either embodiment, since a light shielding part is placed near a part at which the above mentioned photocatalyst treatment layer and hole injecting layer are placed with a gap, as compared with the case of using a photomask, an influence by scattering of energy in the substrate and the like can be reduced, therefore, pattern irradiation with energy can be conducted extremely precisely.

Further, in an embodiment in which a light shielding part is formed on the above mentioned photocatalyst treatment layer, in placing a photocatalyst treatment layer and the hole injecting layer with a predetermined gap, by allowing the thickness of the light shielding part to coincide with this gap, there is a merit that the above mentioned light shielding part can be used as a spacer to make the above mentioned gap constant.

Namely, in placing the above mentioned photocatalyst treatment layer and hole injecting layer with a predetermined gap, by placing the above mentioned light shielding part and hole injecting layer in close adherence condition, the above mentioned predetermined gap can be exact, and by conducting energy irradiation from a photocatalyst treatment layer substrate in this condition, a pattern can be formed with high precision on the hole injecting layer.

Such a light shielding part formation method is not particularly limited, and is appropriately selected and used depending on the property of the light shielding part formation surface, necessary shielding property against energy, and the like.

For example, the light shielding part may also be formed by forming a thin film of a metal such as chromium and the like having a thickness of about 1000 to 2000 Å by a sputtering method, vacuum vapor deposition method and the like, and patterning this thin film. As this patterning method, a usual patterning method such as sputter and the like can be used.

It may also be a method in which a layer of a resin binder containing light shielding particles such as carbon fine particles, metal oxides, inorganic pigments, organic pigments, and the like is formed into a pattern. As the resin binder, a mixture of one kind or two or more kinds of resins such as polyimide resins, acrylic resins, epoxy resins, polyacrylamides, polyvinyl alcohol, gelatin, casein, cellulose and the like, a photosensitive resin, further, O/W emulsion type resin composition, for example, that obtained by emulsifying a reaction silicone, and the like can be used. The thickness of such a resin light shielding part can be set within a range of 0.5 to 10 μm. As such a resin light shielding part patterning method, methods generally used such as a photolithography method, printing method and the like can be used.

In the above mentioned illustrations, two cases of the light shielding part formation position of between a substrate and a photocatalyst treatment layer, and at the surface of a photocatalyst treatment layer have been described, and additionally, it is also possible to adopt an embodiment in which a light shielding part is formed on the side of surface of a substrate on which a photocatalyst treatment layer is not formed. In this embodiment, there is, for example, a case in which a photomask is closely adhered to this surface to a releasable extent, and it can be used suitably when a pattern formed body is changed at small lot.

④ Primer Layer

In the present invention, in the case of forming a light shielding part into a pattern on a substrate as described above and forming a photocatalyst treatment layer on this to give a photocatalyst treatment layer substrate, it is preferable to form a primer layer in between the above mentioned light shielding part and photocatalyst treatment layer.

Though the action and function of this primer layer are not necessarily clear, it is supposed that, by formation of a primer layer in between a light shielding part and a photocatalyst treatment layer, the primer layer performs a function of preventing diffusion of impurities, from a light shielding part and from an aperture present in between light shielding parts, which is a cause of disturbing decomposition and removal of the hole injecting layer by the action of a photocatalyst, particularly, impurities such as a residue generating in patterning of the light shielding part, metals, metal ions and the like. Therefore, by forming a primer layer, a treatment of decomposition removal progresses at high sensitivity, and resultantly, a pattern of high resolution can be obtained.

In the present invention, the primer layer prevents the influence of impurities, on the action of a photocatalyst, present not only at a light shielding part but also at an aperture formed between light shielding parts, therefore, it is preferable that the primer layer is formed on the entier surface of a light shielding part including an aperture.

Figure 6:
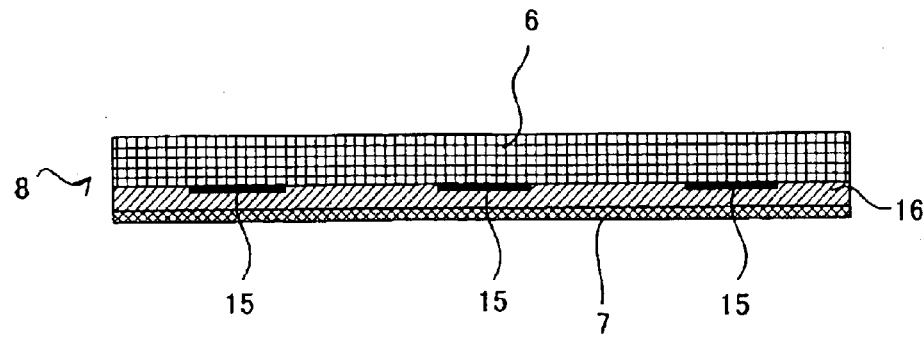
FIG. 6 is a schematic sectional view showing another example of a photocatalyst treatment layer substrate in the present invention.

FIG. 6 shows one example of a photocatalyst treatment layer substrate having such a primer layer formed. A primer layer 16 is formed on the surface of the light shielding part 15 formed side of a substrate 6 with a light shielding part 15, and a photocatalyst treatment layer 7 is formed on the surface of this primer layer 16.

The above mentioned constitution in which a light shielding part is formed into a pattern on a substrate is a constitution of a general photomask. Therefore, it can be concluded that this primer layer is obtained by forming a photocatalyst treatment layer on a photomask via a primer layer.

The primer layer in the present invention is not particularly limited as long as it has a constitution in which a photocatalyst treatment layer and a photomask are placed so as not to contact physically. Namely, a primer layer has to be formed so that a light shielding part of a photomask and a photocatalyst treatment layer do not contact.

The material constituting this primer layer is not particularly limited, however, an inorganic material which is not easily decomposed by the action of a photocatalyst is preferable. Specifically an amorphous silica can be listed. When such amorphous silica is used, this amorphous silica precursor is a silicon compound of the general formula $SiX_4$ in which X represents a halogen, methoxy group, ethoxy group, acetyl group or the like, and silanols which are hydrolyzates of these silicon compounds, or polysiloxanes having an average molecular weight of 3000 or less, are preferable.

The thickness of the primer layer is preferably in a range of 0.001 μm to 1 μm, particularly preferably in a range of 0.001 μm to 0.1 μm.

(2) Placing of Photocatalyst Treatment Layer and Hole Injecting Layer

In the present invention, a photocatalyst treatment layer of the above mentioned photocatalyst treatment layer substrate and the hole injecting layer are placed with a gap of 200 μm or less, then, by irradiating energy from predetermined direction, the hole injecting layer is decomposed and removed in a pattern. The gap of 200 μm or less also includes a condition in which a photocatalyst treatment layer and the hole injecting layer are in contact to each other.

By thus placing a photocatalyst treatment layer and the surface of the hole injecting layer in separation with a predetermined clearance, an active oxygen species generated from oxygen, water and a photocatalyst action is easily released. Namely, when placed in separation with larger clearance than the above mentioned range, the generated active oxygen species can not easily reach the hole injecting layer, and there is a possibility of deteriorating the decomposition removal rate, which is not preferable. In contrast, when the clearance of a photocatalyst treatment layer and the hole injecting layer is too narrow, an active oxygen species generated from oxygen, water and a photocatalyst action is not easily desorbed, and resultantly, there is a possibility of deteriorating the decomposition removal rate, which is not preferable.

It is preferable that the above mentioned clearance in the present invention is particularly in a range of 0.2 μm to 10 μm, preferably in a range of 1 μm to 5 μm, in view of excellent pattern precision, high sensitivity of a photocatalyst, and consequently, excellent efficiency of decomposition removal.

On the other hand, when an EL element having a large area such as, for example, 300 mm×300 mm is manufactured, it is extremely difficult to provide fine gap as described above in between a photocatalyst treatment layer substrate and the hole injecting layer. Therefore, when an EL element of relatively large area is manufactured, it is preferable that the above mentioned gap is in a range of 10 to 100 μm, particularly in a range of 50 to 75 μm. By setting the gap in such a range, a problem of deterioration in pattern precision such as diffusion of a pattern and the like, and a problem of deterioration of the sensitivity of a photocatalyst to deteriorate efficiency of decomposition removal and the like, are not caused.

When irradiating an EL element having such relatively large area with energy, it is preferable that the setting of the gap in an aligning apparatus, of the photocatalyst treatment layer substrate and the hole injecting layer, of an energy irradiating apparatus is set in a range of 10 μm to 200 μm, particularly in a range of 25 μm to 75 μm. By setting the value in such a range, without occurring significant deterioration in pattern precision or significant deterioration of the sensitivity of a photocatalyst, and also the photocatalyst treatment layer substrate and the hole injecting layer can be placed without being in contact with each other.

In the present invention, placing condition with such gap may be maintained only at least during irradiation with energy.

As the method of placing the photocatalyst treatment layer and the hole injecting layer with such evenly formed narrow gap, for example, a method of using a spacer is mentioned. By using a spacer as described above, even gap can be formed, and also, since the action of a photocatalyst is not exerted to the surface of the hole injecting layer, at a part to which this space contacts, by allowing this spacer to have the same pattern as that described above, a predetermined pattern can be formed on the hole injecting layer.

In the present invention, such a spacer can be formed as one member. However, for simplifying the process and the like, it is preferable to form the spacer on the surface of the photocatalyst treatment layer of the photocatalyst treatment layer substrate as described in the above mentioned column of "Photocatalyst treatment layer substrate". In the above mentioned item of "Photocatalyst treatment layer substrate", the spacer is illustrated as a light shielding part, however, in this embodiment, since such a spacer is only required to have an action of protecting the surface so that the action of a photocatalyst is not exerted on the surface of the hole injecting layer, it may be formed of a material having no function of shielding irradiated energy.

(3) Energy Irradiation

Next, irradiation with energy will be described. Irradiation with energy to apart, which a photocatalyst treatment layer and the hole injecting layer are facing to each other, is conducted under condition of maintaining the above mentioned contact condition.

Usually, the wavelength of light used in irradiation with energy is set at 400 nm or less, preferably 380 nm or less. The reason for this is that, as described above, the preferable photocatalyst used in a photocatalyst treatment layer is titanium dioxide, and light having the above mentioned wavelength is preferable as energy to activate the action of a photocatalyst with this titanium dioxide.

As the light source which can be used in such energy irradiation, a mercury lamp, metal halide lamp, xenon lamp, excimer lamp, and other various light sources are listed.

In addition to methods of conducting pattern irradiation via a photomask using the above mentioned light source, methods of conducting drawing irradiation in the form of pattern using lasers such as excimer, YAG and the like can also be used.

The dose of energy in irradiation with energy is a dose necessary for causing decomposition removal of the hole injecting layer by the action of a photocatalyst in the photocatalyst treatment layer.

In this case, by irradiating energy while heating the photocatalyst treatment layer, sensitivity can be increased and decomposition removal can be efficiently carried out, being preferable. Specifically, it is preferable to heat in a range of 30° C. to 80° C.

The energy irradiation direction in the present invention is determined by a pattern formation method such as the light shielding part is formed on the photocatalyst treatment layer substrate or not, or by direction of taking out the light from a photocatalyst treatment layer substrate or an EL element, and the like.

Namely, when a light shielding part is formed on the photocatalyst treatment layer substrate, energy irradiation needs to be conducted from the photocatalyst treatment layer substrate side, and in this case, a substrate used in the photocatalyst treatment layer substrate needs to be transparent. In this case, even when the light shielding part is formed on the photocatalyst treatment layer, and this light shielding part on the photocatalyst treatment layer side is used to show a function as a spacer, the energy irradiation direction may be from the photocatalyst treatment layer substrate side or from the EL element side.

As described above, in the case of the photocatalyst treatment layer is formed in a pattern, the direction of energy irradiation may be from any direction as long as the part, at which the photocatalyst treatment layer and the hole injecting layer contact, is irradiated with energy.

Likewise, also when the above mentioned spacer is used, irradiation may be conducted from any direction as long as the contacting part is irradiated with energy.

When a photomask is used, irradiation with energy is conducted from the side at which a photomask is placed. In this case, it is necessary that the side, at which a photomask is placed, is transparent.

When the irradiation with energy as described above is completed, the photocatalyst treatment layer substrate is separated from a position facing to the hole injecting layer, and for example, by this, a hole injecting layer 5 formed in a pattern as shown in FIG. 1D can be obtained.

In the present invention, patterning of a light emitting layer is conducted by using a hole injecting layer, and in this process, a region irradiated with energy on this hole injecting layer is decomposed and removed by the action of a photocatalyst and a pattern of the presence or absence of a hole injecting layer is formed.

As mentioned above, after irradiation with energy, a photocatalyst treatment layer substrate is remove, by this, a hole injecting layer formed in a pattern of the presence or absence of a hole injecting layer, namely, in a pattern composed of regions where the hole injecting layer is remaining, and regions where hole injecting layer is decomposed and removed, can be obtained.

D. Light Emitting Layer Forming Process

Next, the light emitting layer forming process will be illustrated. The light emitting layer forming process in the present invention is a process of forming a light emitting layer into a pattern by utilizing a difference in wettability of the hole injecting layer and the surface which is bared by the decomposition and removal of the hole injecting layer, such as a liquid repellent convex part 4 and an insulating layer 3, as shown in FIG. 1D.

The method of forming a light emitting layer in this process is not particularly limited as long as it is a method capable of forming in a pattern by utilizing a difference in wettability of the hole injecting layer and the surface which is bared by the decomposition and removal of the hole injecting layer. Specifically, methods of coating a material forming a light emitting layer on the whole surface as the coating solution such as a spin coating method, casting method, dipping method, bar coating method, blade coating method, roll coating method, gravure coating method, spray coating method and the like, and discharging methods and the like using a dispenser or ink jet, are listed. Among them, discharging methods are preferable, and particularly, an ink jet method is preferable. The reason for this is that a highly precise pattern can be formed by utilizing a pattern of a wettability difference of the hole injecting layer and the surface which is bared by the decomposition and removal of the hole injecting layer.

In a case a light emitting layer forming coating solution is used as a coating solution for forming a light emitting layer by coating, when a full color EL element is manufactured, a plural kinds of light emitting layer forming coating solutions are used. Materials constituting the light emitting layer forming coating solution will be illustrated below.

(1) Light Emitting Material

The light emitting material used in the present invention is not particularly limited as long as it contains a fluorescence emitting material and it shows light emission. It can have a light emitting function, hole transporting function and electron transporting function at the same time.

As such light emitting materials, dye based materials, metal complex based materials and polymer based materials are listed.

① Dye Based Material

As the dye based material, cyclopentamine derivatives, tetraphenylbutadiene derivatives, triphenylamine derivatives, oxadiazole derivatives, pyrazoloquinoline derivatives, distyrylbenzene derivatives, distyrylarylene derivatives, silol derivatives, thiophene ring compounds, pyridine ring compounds, perynone derivatives, perylene derivatives, oligothiophene derivatives, trifumanylamine derivatives, oxaziazole dimer, pyrazoline dimer and the like are listed.

② Metal Complex Based Material

As the metal complex based material, metal complexes having Al, Zn, Be and the like or a rare earth metal such as Tb, Eu, Dy and the like as the center metal and oxadiazole, thiadiazole, phenylpyridine, phenylbenzimidazole, quinoline structure and the like as the ligand, such as an alumiquinolinol complex, benzoquinolinolberyllium complex, benzooxazolezinc complex, benzothiazolezinc complex, azomethylzinc complex, porphyrinzinc complex, europium complex and the like are listed.

③ Polymer Based Material

As the polymer based material, those obtained by polymerizing polyparaphenylenevinylene derivatives, polythiophene derivatives, polyparaphenylene derivatives, polysilane derivatives, polyacetylene derivatives, polyfluorene derivatives, polyvinylcarbazole derivatives, the above mentioned dyes, metal complex based light emitting materials, and the like are listed.

In the present invention, it is more preferable to use the above mentioned polymer based material as the light emitting material from the standpoint of utilization of a merit that a light emitting layer can be formed at good precision with light emitting layer forming coating solution by utilizing a difference in wettability of the hole injecting layer and the surface which is bared by the decomposition and removal of the hole injecting layer.

(2) Solvent

As the solvent for dissolving or dispersing the above mentioned light emitting material to give light emitting layer forming coating solution is not particularly limited as long as it is a solvent capable of dissolving or dispersing the above mentioned light emitting material and providing predetermined viscosity and solid concentration.

Specifically, chloroform, methylene chloride, dichloroethane, tetrahydrofuran, toluene, xylene, tetralin, tetramethylbenzene and the like are listed.

(3) Additive

Into the light emitting layer forming coating solution used in the present invention, various additives can be added in addition to the above mentioned light emitting materials and solvents. For example, a doping material is added in some cases for the purpose of improving light emitting efficiency in a light emitting layer and changing wavelength of emitting light. As this doping material, for example, perylene derivatives, coumarin derivatives, rubrene derivatives, quinacridone derivatives, squalirium derivatives, porphyrin derivatives, styrylbaseddyes, tetracene derivatives, pyrazolinederivatives, decacyclene, phenoxazone and the like are listed. In the case of forming a light emitting layer by an ink jet method, a surfactant and the like are added in some cases for the purpose of improving discharge ability.

E. Second Electrode Layer Forming Process

In the present invention, an EL element can be manufactured by further providing a second electrode layer on the light emitting layer form in a pattern, after the above mentioned light emitting layer forming process.

In such a process, for example, when light is taken out from the upper direction of the EL element shown in FIG. 1F, a second electrode layer can be formed using the above mentioned transparent electrode material. In contrast, in the EL element shown in FIG. 1F, when light is taken out from the lower direction, transparency is not particularly required to the second electrode layer, and the second electrode layer made of a metal can also be used.

Additionally, a barrier layer of protecting an organic EL layer such as a light emitting layer and the like from the influence of oxygen and water vapor, and a low refractive index layer preventing confinement of light within the element may be provided on the second electrode layer.

II. EL Element

Next, EL element of the present invention will be explained.

The EL element of the present invention is an EL element wherein a hole injecting layer is utilized for patterning a light emitting layer.

The above mentioned EL element of the present invention comprises: at least a substrate, a first electrode layer formed in a pattern on the substrate surface, a hole injecting layer, formed on the first electrode layer, which can be decomposed and removed by the action of a photocatalyst in irradiation with energy, a light emitting layer formed on the hole injecting layer, and a second electrode layer formed on the light emitting layer.

In the present invention, since the hole injecting layer, which can be decomposed and removed by an action of the photocatalyst by energy irradiation, is used, the hole injecting layer can be patterned easily by irradiating energy via a photocatalyst. Therefore, layer-by-layer self-assembled film and the like, which was difficult to use conventionally, can be used as a hole injecting layer so that EL element with high light emitting efficiency can be obtained.

The above mentioned EL element of the present invention will be explained referring to the figures.

Figure 2:
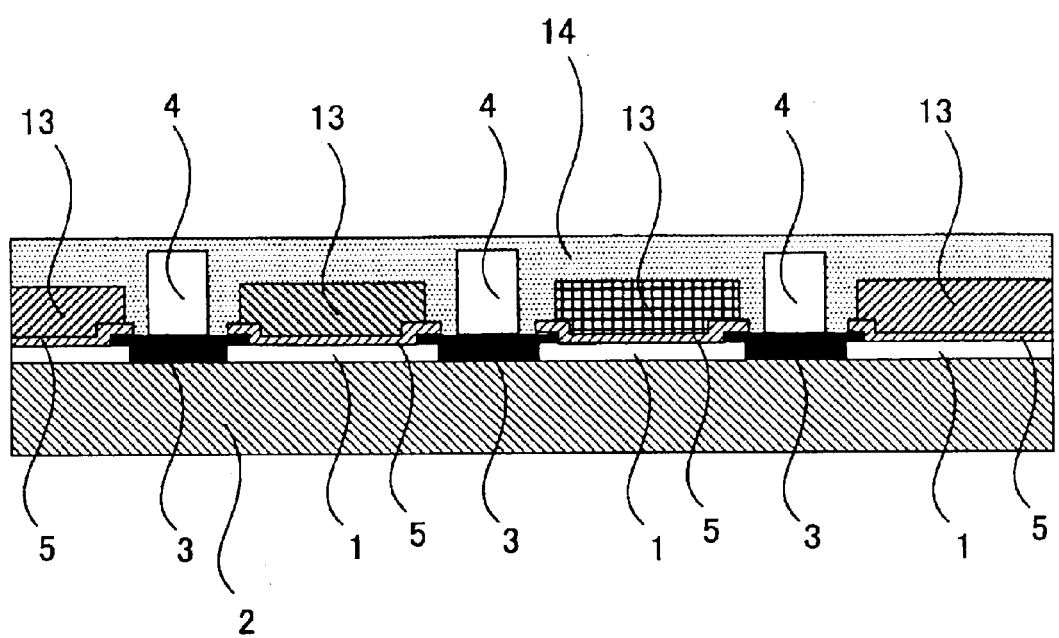
FIG. 2 is a schematic sectional view showing one example of an EL element in the present invention.

FIG. 2 shows an example of the EL element of the present invention. First, first electrode layer 1 is formed in a pattern on a substrate 2. In between the first electrode layers 1, insulating layers 3 is provided so as to cover the edge part of the first electrode layers 1. Moreover, liquid repellent convex part 4 is formed on this insulating layer 3, and the width of the liquid repellent convex part 4 is formed narrower than the width between the first electrode layers 1. Further, on the first electrode layer 1, a hole injecting layer 5, which has a property of being decomposed and removed by an action of the photocatalyst by energy irradiation, is provided in a pattern. Since the hole injecting layer 5 has better wettability than the liquid repellent convex part 4, by forming the hole injecting layer 5 in a pattern, a pattern of wettability difference can be formed. And by utilizing this wettability difference, the light emitting layer 13 is formed on the hole injecting layer 5. Further, a second electrode layer 14 is formed on the light emitting layer.

The above mentioned EL element of the present invention can be manufactured, for example, by the above mentioned method for manufacturing the EL elemenet.

Moreover, elements constituting such EL element are the same as those described in the above mentioned method for manufacturing EL element, therefore, explanations are omitted.

The present invention is not limited to the above mentioned embodiments. The above mentioned embodiments are only examples, and any embodiments having substantially the same constitution and performing the same action and effect as the technological idea described in claims of the present invention are included in the technological range of the present invention.

EXAMPLES

The following examples will further illustrate the present invention.

(Formation of Insulating Layer)

On a substrate which ITO is formed on a glass substrate as a transparent substrate, film of polyimide (PW1001, manufactured by Toray Industries, Inc.) which is a positive type photosensitive material was formed as an insulating layer by the spin coating method, so as to cover the edge part of the first electrode layer. The film thickness was 1.3 $\mu$m. Further, the above was patterned by photolithography so that the first electrode layer formed part will be an opening part. After that, heat treatment was carried out at 250° C. for 30 minutes. And a substrate with ITO opening part of width of 100 $\mu$m, and the width between the first electrode layers of width of 26 $\mu$m was formed.

(Formation of Patterning Assisting Layer)

5 wt % of Modiper F200 (manufactured by NOF Corporation) was added as a water repellent material into polyimide (PW1001, manufactured by Toray Industries, Inc.) which is a positive type photosensitive material, and spin coated on the entire surface of the substrate to form a film of 2.5 $\mu$m thickness. Next, irradiation and development was carried out so as the 20 $\mu$m width polyimide will be remained in between the center of the ITO electrodes, and heat treatment is carried out at 250° C. for 30 minutes.

(Surface Treatment of the Substrate) (Silane Coupling)

As silane coupling treatment of the substrate surface, the substrate was immersed in 5 vol % 3-aminopropyl trimethoxy silane (manufactured by Shinetu Silicone Inc.) toluene solution at 100° C. for 2 hours, and cleaned with toluene. Next, the substrate was immersed in N,N-dimethylformamide solution containing 5 vol % of CH3I, 5 vol % of (CH3CH2)3N, at room temperature for 2 hours, thereby substituted the amino group on the end of the alkyl chain with trimethylanmonium group (—N(CH3)3+) which is PH independent. After that, the substrate was cleaned with methanol, ultrapure water, and IPA in this order, and dried at 100° C.

(Formation of Hole Injecting Layer (Layer-By-Layer Self-Assembling Process))

PEDOT/PSS (manufactured by Bayer Yakuhin, Ltd.) was used as polymer anionic electrolyte solution. 1×10−3M polyallylamine hydrochloride which is adjusted to PH 3 with hydrochloric acid is used respectively as a polymer anionic electrolyte solution.

A process of immersing in the polymer cationic electrolyte solution for 10 minutes, cleaning with ultrapure water, immersing in the polymer anionic electrolyte solution for 10 minutes, and cleaning with ultrapure water, as one process, was repeater for 5 times without drying the substrate surface.

(Hole Injecting Layer Removing Process)

A titanium oxide film was formed on the entire surface of a photomask in which openings are formed so as only the patterning assisting layer parts are exposed. Using this photomask, the hole injecting layer is removed by exposing only the patterning assisting layer to ultraviolet ray.

(Heating Treatment Process)

After removing the hole injecting layer, the heating treatment was carried out to the substrate in atmosphere at 150° C. for 1 hour.

(Light Emitting Layer Coating Process)

Polyparaphenylene vinylene derivative (MEH-PPV) mesitylene solution was coated with an ink jet apparatus which discharges the ink by applying voltage to piezo element.

(Formation of Second Electrode Layer)

By a vacuum deposition apparatus, Ca was formed into a film of 1000 Å, and Al was formed into a film of 2000 Å as protecting electrode.

COMPARATIVE EXAMPLE

EL element was produced by the same procedure as the example 1 except the hole injecting layer removing process.

[Evaluation]

Connecting the ITO electrode side to the positive electrode and metal electrode side to the negative electrode, direct current was applied with a source meter.

In the example 1, at applied voltage of about 7 V, light emission of wavelength of 580 nm was observed evenly on the entire surface of the substrate. Moreover, by a microscope observation of the light emitting part, it was confirmed that lines of width of 85 µm were emitting light evenly.

In the comparative example 1, at applied voltage of about 12 V, light emission of wavelength of 580 nm was observed. However, several non-emitting parts were observed in the substrate. By a microscope observation of the light emitting part, several parts, in which the light emitting layer reaches to the next pixel from the lines of width of 85 µm, were observed.

What is claimed is:

1. A method for manufacturing an electroluminescent element comprising at least: a hole injecting layer forming process of forming a hole injecting layer, which can be decomposed and removed by the action of a photocatalyst in irradiation with energy, on a first electrode layer formed side surface of a base material with the first electrode layer formed on the surface in a pattern; a decomposition removing process of using a photocatalyst treatment layer substrate having at least a photocatalyst treatment layer containing a photocatalyst formed on a substrate, placing the base material with the hole injecting layer formed thereon and the photocatalyst treatment layer substrate with a gap of 200 µm or less so that the photocatalyst treatment layer substrate and the hole injecting layer are facing to each other, and then, decomposing and removing the hole injecting layer in between the first electrode layers, in a pattern, on the base material with the hole injecting layer formed thereon by irradiating with energy from predetermined direction; a light emitting layer forming process of forming the light emitting layer on the pattern formed hole injecting layer remaining on the base material; and a second electrode layer forming process of forming the second electrode layer on the light emitting layer; wherein a contact angle to a liquid of the surface of the hole injecting layer is smaller than the contact angle to a liquid of the surface bared by removing the hole injecting layer in the decomposition removing process.

2. The method for manufacturing an electroluminescent element according to claim 1, wherein a liquid repellent convex part is formed in between the first electrode layers.

3. The method for manufacturing an electroluminescent element according to claim 2 wherein a width of the liquid repellent convex part is narrower than a clearance in between the first electrode layers.

4. The method for manufacturing an electroluminescent element according to claim 1 wherein the hole injecting layer is a layer-by-layer self-assembled film consisting of a cationic polymer and an anionic polymer.

5. The method for manufacturing an electroluminescent element according to claim 4 wherein an outermost film of the layer-by-layer self-assembled film is a film comprising a semiconductor polymer or an insulating polymer.

6. The method for manufacturing an electroluminescent element according to claim 1 wherein the photocatalyst treatment layer substrate comprises the substrate and the photocatalyst treatment layer formed in a pattern on the substrate.

7. The method for manufacturing an electroluminescent element according to claim 1 wherein the photocatalyst treatment layer substrate comprises the substrate, photocatalyst treatment layer formed on the substrate, and a photocatalyst treatment layer side light shielding part formed in a pattern, and the irradiation with energy in the decomposition removing process is carried out from the photocatalyst treatment layer substrate.

8. The method for manufacturing an electroluminescent element according to claim 7 wherein the photocatalyst treatment layer substrate is that the photocatalyst treatment layer side light shielding part is formed on the substrate in a pattern, and the photocatalyst treatment layer is further formed thereon.

9. The method for manufacturing an electroluminescent element according to claim 8 wherein the photocatalyst treatment layer substrate is that the photocatalyst treatment layer is formed on the photocatalyst treatment layer side light shielding part, via a primer layer, formed in a pattern on the transparent substrate.

10. The method for manufacturing an electroluminescent element according to claim 1 wherein the photocatalyst treatment layer is a layer consisting of a photocatalyst.

11. The method for manufacturing an electroluminescent element according to claim 10 wherein the photocatalyst treatment layer is a layer formed by forming a film of the photocatalyst on the substrate by a vacuum film forming method.

12. The method for manufacturing an electroluminescent element according to claim 1 wherein the photocatalyst treatment layer is a layer comprising the photocatalyst and a binder.

13. The method for manufacturing an electroluminescent element according to claim 1 wherein the photocatalyst is one kind or two or more kinds of substances selected from titanium oxide ($TiO_2$), zincoxide (ZnO), stannicoxide ($SnO_2$), strontiumtitanate ($SrTiO_3$), tungsten oxide ($WO_3$), bismuth oxide ($Bi_2O_3$) and iron oxide ($Fe_2O_3$).

14. The method for manufacturing an electroluminescent element according to claim 13 wherein the photocatalyst is titanium oxide ($TiO_2$).

15. The method for manufacturing an electroluminescent element according to claim 1 wherein in irradiation with energy in the decomposition removing process, the gap between the photocatalyst treatment layer and the hole injecting layer is in a range of 0.2 µm to 10 µm.

16. The method for manufacturing an electroluminescent element according to claim 1 wherein the light emitting layer forming process is a process of coating a light emitting layer forming coating solution on the hole injecting layer by an ink jet method.

* * * * *